United States Patent
Uchida

(10) Patent No.: US 8,174,092 B2
(45) Date of Patent: *May 8, 2012

(54) SEMICONDUCTOR DEVICE HAVING HIGH FREQUENCY WIRING AND DUMMY METAL LAYER AT MULTILAYER WIRING STRUCTURE

(75) Inventor: Shinichi Uchida, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/064,325

(22) Filed: Mar. 18, 2011

(65) Prior Publication Data

US 2011/0169130 A1    Jul. 14, 2011

Related U.S. Application Data

(63) Continuation of application No. 12/285,362, filed on Oct. 2, 2008, now Pat. No. 7,932,578.

(30) Foreign Application Priority Data

Oct. 10, 2007   (JP) .................................. 2007-264766

(51) Int. Cl.
  *H01L 29/00* (2006.01)
  *H01L 21/8238* (2006.01)
(52) U.S. Cl. ........................ 257/531; 438/210
(58) Field of Classification Search ................ 438/210, 438/238, 926; 257/516, 531, E21.022
  See application file for complete search history.

(56) References Cited

U.S. PATENT DOCUMENTS

| | | | |
|---|---|---|---|
| 6,730,983 B2 | 5/2004 | Minami | |
| 7,161,248 B2 | 1/2007 | Karasawa et al. | |
| 7,211,897 B2 | 5/2007 | Yamanoue et al. | |
| 7,932,578 B2 * | 4/2011 | Uchida | ........................ 257/531 |
| 2002/0036335 A1 | 3/2002 | Minami | |
| 2005/0212136 A1 | 9/2005 | Karasawa et al. | |

FOREIGN PATENT DOCUMENTS

| | | |
|---|---|---|
| JP | 2002-110908 | 4/2002 |
| JP | 2003-37111 | 2/2003 |
| JP | 2005-285970 | 10/2005 |

* cited by examiner

*Primary Examiner* — Calvin Lee
(74) *Attorney, Agent, or Firm* — McGinn IP Law Group, PLLC

(57) ABSTRACT

A semiconductor device, includes a semiconductor device, a wiring layer provided on the semiconductor substrate, a high frequency wiring provided in the wiring layer, and plural dummy metals provided in the wiring layer apart from the high frequency wiring, wherein the wiring layer in plan view includes a high frequency wiring vicinity region and an external region surrounding the high frequency wiring vicinity region, wherein the high frequency wiring vicinity region includes a first region enclosed by an outer edge of the high frequency wiring, and a second region surrounding the first region, wherein the plural dummy metals are disposed dispersedly in the high frequency wiring vicinity region and in the external region respectively, and wherein an average interval between the dummy metals in the high frequency wiring vicinity region is wider than that in the external region.

4 Claims, 8 Drawing Sheets

SEMICONDUCTOR DEVICE HAVING HIGH FREQUENCY WIRING AND DUMMY METAL LAYER AT MULTILAYER WIRING STRUCTURE

This application is a continuation of U.S. patent application Ser. No. 12/285,362, filed Oct. 2, 2008, now U.S. Pat. No. 7,932,578 issued Apr. 26, 2011, the disclosure of which is incorporated herein in its entirety by reference.

This application is based upon and claims the benefit of priority from Japanese patent application No. 2007-264766, filed on Oct. 10, 2007, the disclosure of which is incorporated herein in its entirety by reference.

BACKGROUND OF THE INVENTION

1. Field of the Invention

The present invention relates to a semiconductor device and more particularly to a semiconductor device that includes a high frequency wiring.

2. Description of Related Art

There is a well-known technique that forms a multilayer wiring structure by forming at first such recesses as wiring grooves, via-holes, etc. in an interlayer insulation film, then by filling the recesses with a metal material and by removing the metal material exposed outside the recesses by a CMP (Chemical Mechanical Polishing) process or the like, thereby forming wirings and via-holes. In case of such a technique, if any density difference exists among those formed wirings and via-holes, then hollows and dents referred to as erosion and dishing often come to appear in the CMP process. And this might result in variation of the in-plane film thickness in the CMP process. In order to prevent the occurrence of such erosion and dishing in the CMP process, dummy metals are used. The dummy metals are disposed at a fixed density and of electrically floating state. The dummy metals are thus provided as layers other than wirings provided to flow a current. Providing such dummy metals makes it easier to manufacture semiconductor devices.

When dummy metals are placed between a high frequency wiring of an inductor, transformer, or the like and the semiconductor substrate, however, the capacitance between the semiconductor substrate and the high frequency wiring increases in accordance with the thickness of the dummy metals, since the capacitance is determined by the series of the capacitance determined by a distance between the high frequency wiring and the dummy metals and the capacitance determined by a distance between the dummy metals and the semiconductor substrate. Consequently, the characteristics of the inductor and the transformer are degraded. This has been a problem.

The patent document 1 (Japanese Unexamined Patent Application Publication No. 2002-110908) describes a configuration having a convex portion formed in a region except for the region just under a spiral linear conductor layer. The convex portion constitutes a dummy element region.

The patent document 2 (Japanese Unexamined Patent Application Publication No. 2005-285970) describes a configuration that does not dispose any conductive pattern in a region having such functional elements as an inductor. The structure can avoid the influence by the conductive pattern to be exerted on those functional elements. Moreover, dummy patterns are disposed in a region surrounding the functional elements disposed region. by using such structures, the flatness of the surface after a CMP process can be improved.

The patent document 3 (Japanese Unexamined Patent Application Publication No. 2003-37111) describes a configuration having a metal film that has a specific pattern formed in a no-real-wiring-provided region on a semiconductor device. In a region having two metal wirings formed in parallel, the metal film is disposed so as to be separated from the region by a distance longer than a predetermined distance.

SUMMARY OF THE INVENTION

However, if no dummy metal is disposed just under such an element as an inductor, then variation might occur among formed patterns when recesses are formed in those patterns, thereby erosion, dishing, etc. might not be prevented effectively.

Furthermore, the present inventor et al have also found a problem that if a high frequency wiring is provided for an inductor, transformer, or the like, the parasitic capacity components of the inductor and the transformer increase due to not only the existence of the dummy metals just under the high frequency wiring, but also the existence of its surrounding dummy metals.

According to an aspect of the present invention, a semiconductor device includes a semiconductor substrate, a plurality of wiring layers provided on the semiconductor substrate, a high frequency wiring provided in the plurality of wiring layer, and a plurality of dummy metals provided in a second layer provided between the semiconductor substrate and a first layer having the high frequency wiring. The plurality of wiring layers at a top view includes a high frequency wiring vicinity region and an external region surrounding the high frequency wiring vicinity region, the high frequency wiring vicinity region including a first region enclosed by an outer edge of the high frequency wiring and a second region surrounding the first region, and the plurality of dummy metals are disposed dispersedly in the high frequency wiring vicinity region and in the external region respectively and an average interval between the dummy metals in the high frequency wiring vicinity region is wider than that in the external region.

Here, the high frequency wiring can function as any of an inductor and a transformer.

If the configuration as described above is taken, then the number of dummy metals disposed between the high frequency wiring and the semiconductor substrate can be reduced in the region near the high frequency wiring at a top view. As a result, the capacitance (parasitic capacity) between the high frequency wiring and the semiconductor substrate can be suppressed, thereby the characteristics of the high frequency wirings of the inductor and the transformer can be kept favorably. On the other hand, even in the region near the high frequency wiring, because dummy metals are disposed dispersedly therein, erosion and dishing can be prevented effectively, thereby manufacturing the semiconductor devices stably.

Any combinations of the above-described components, as well as representations of the present invention can be modified for other methods, devices, systems, etc. effectively as exemplary embodiments of the present invention.

According to the aspect of the present invention, erosion and dishing can be prevented effectively when manufacturing the semiconductor devices provided with high frequency wirings stably and the influences from the surrounding dummy metals on each high frequency wiring can be reduced, thereby improving the characteristics of the semiconductor devices.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
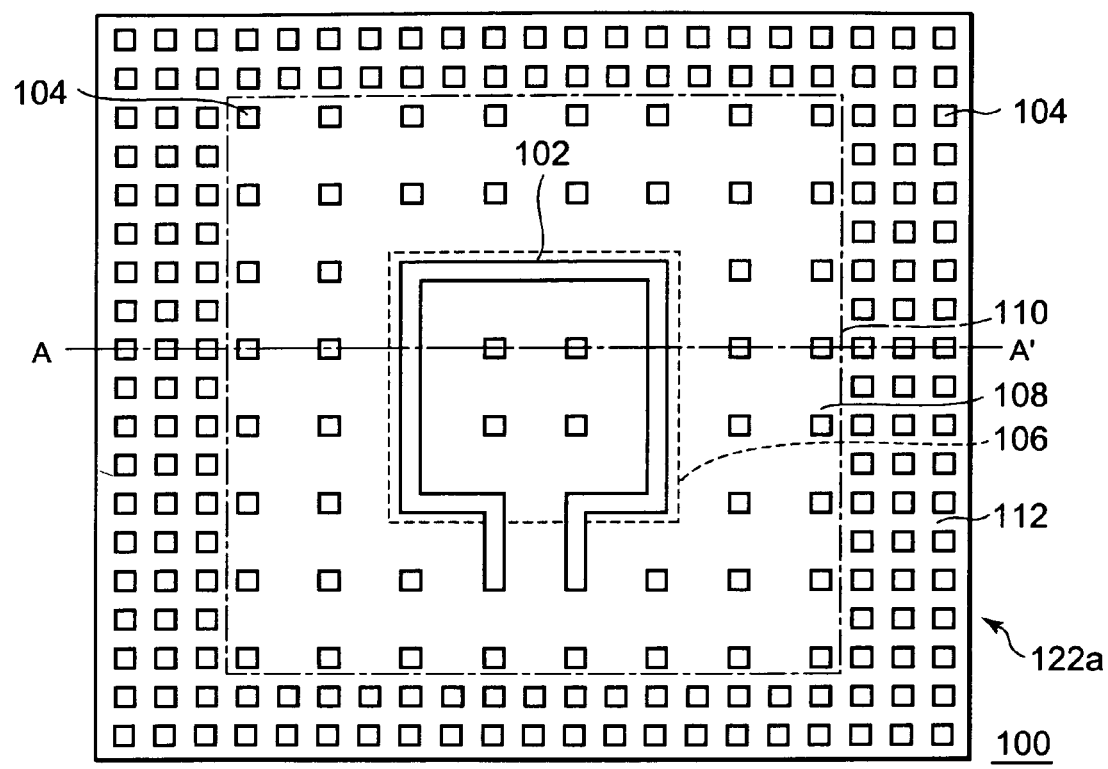
FIG. 1 is a top view of a semiconductor device in an exemplary embodiment of the present invention.
Figure 2:
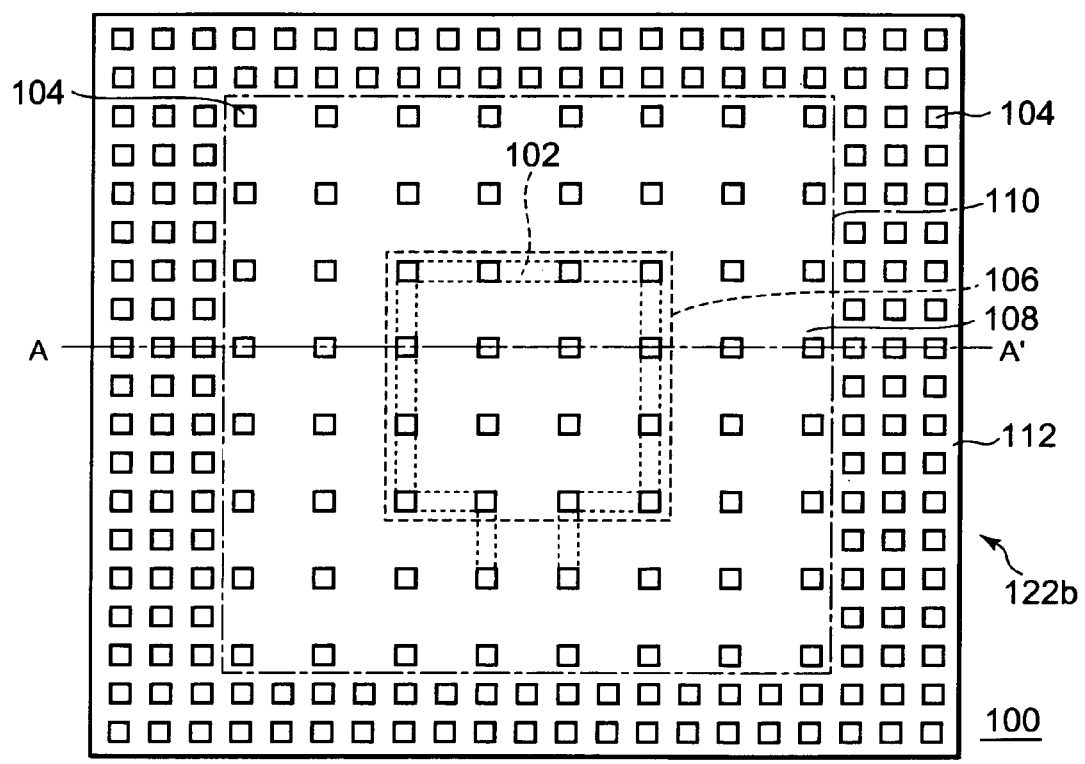
FIG. 2 is another top view of the semiconductor device in the exemplary embodiment of the present invention.
Figure 3:
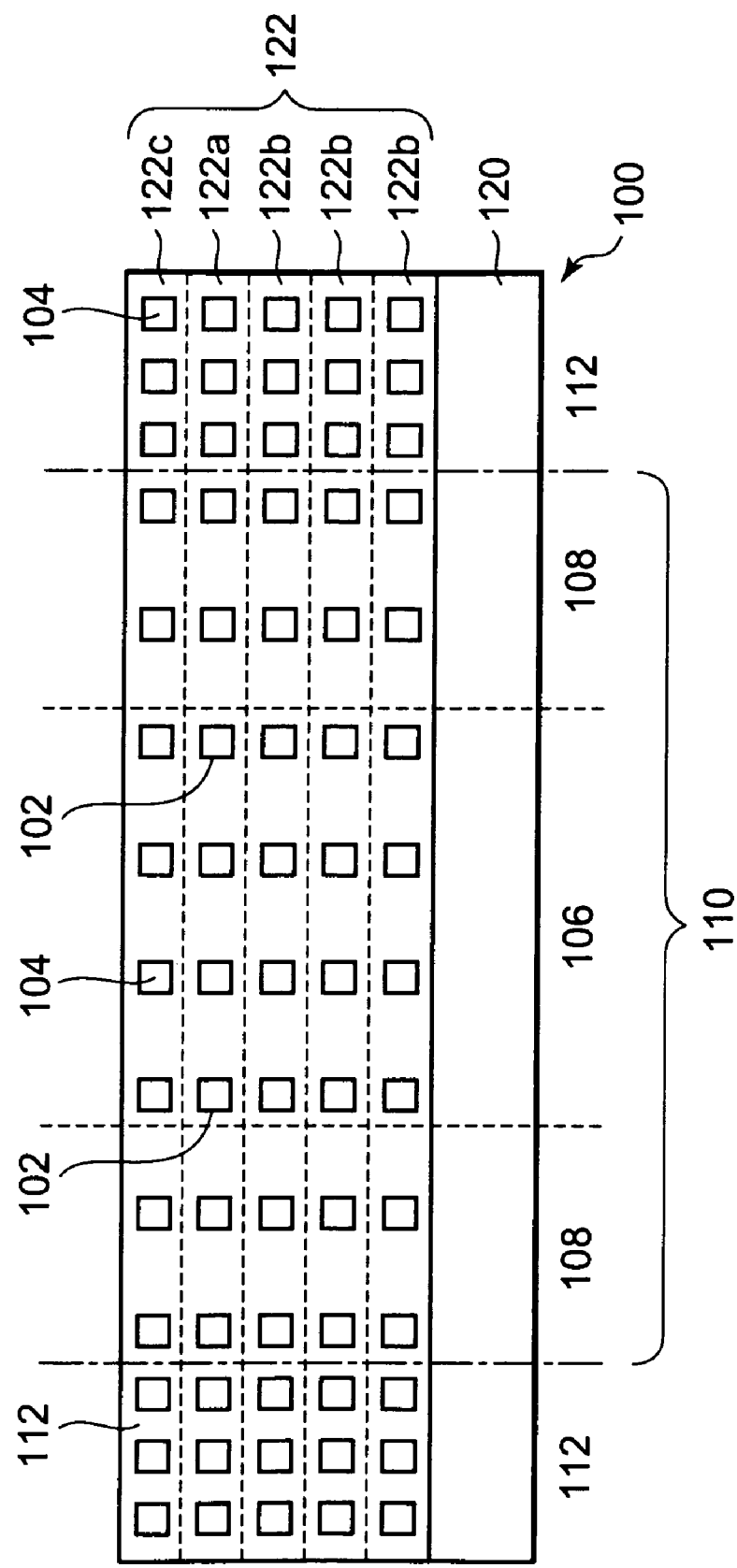
FIG. 3 is a cross sectional view taken on line A-A' of FIGS. 1 and 2.

FIGS. 1 and 2 are top views showing a configuration of a semiconductor device 100 in this first exemplary embodiment respectively. FIG. 3 is a cross sectional view taken on line A-A' of FIGS. 1 and 2.

FIG. 1 is a top view of a first wiring layer 122a (first layer) provided with a high frequency wiring 102 and FIG. 2 is a top view of one of second wiring layers 122b (second layer) provided between the first wiring layer 122a and the semiconductor substrate 120. In FIG. 2, a dotted line shows a region superposed on the high frequency wiring 102 at a top view. The high frequency wiring 102 is formed in a coil pattern at a top view and functions as an inductor or transformer. In the high frequency wiring flown a current having a frequency of, for example, 5 GHz or higher. Dummy metals 104 are provided for the first wiring layer 122a and for each of the second wiring layers 122b. A dummy metal means a conductive pattern which substantially does not affect the circuit provided in the semiconductor device 100.

As shown in FIG. 1, the dummy metals 104 of the first wiring layer 122a are formed both inside and outside the coil-shaped high frequency wiring 102. As shown in FIG. 2, the dummy metals 104 are also provided for the region superposed on the high frequency wiring 102 at a top view.

As shown in FIG. 3, the semiconductor device 100 includes a semiconductor (for example, silicon) substrate 120 and a multilayer wiring layer 122 provided on the semiconductor substrate 120. The multilayer wiring layer 122 includes a first wiring layer 122a, a second wiring layer 122b, and a third wiring layer 122c (third layer) formed over the first wiring layer 122a. A high frequency wiring 102 is also provided for the first wiring layer 122a. A plurality of dummy metals 104 are provided in each of the first wiring layer 122a, the second wiring layer 122b, and the third wiring layer 122c respectively. The third wiring layer 122c is configured just like the second wiring layer 122b shown in FIG. 2.

As shown in FIGS. 1 and 2, the semiconductor device 100 includes a region near the high frequency wiring vicinity region 110 and an external region 102. The region 110 includes a first region 106 surrounded by an outer edge of the high frequency wiring 102 and a second region 108 surrounding the first region 106. The dummy metals 104 are disposed dispersedly in each of the region 110 and the external region 112. The average interval between the dummy metals in the region 110 is wider than that in the external region 112 at a top view. The dummy metals 104 are substantially the same in height, so the dummy metals 104 in each layer are disposed so that the number of dummy metals per unit cubic volume in the region 110 becomes less than that in the external region 112. Furthermore, the dummy metals 104 are disposed so that the number of dummy metals per unit cubic volume in every layer in the vicinity region 110 becomes less than that in the external region 112.

The dummy metals 104 are made of the same material as that of the high frequency wiring 102. The material may be copper, aluminum, or the like. If the high frequency wiring 102 and the dummy metals 104 are made of copper, then the damascene method is used to form them. The high frequency wiring 102 and the dummy metals 104 should preferably be formed at the same time.

Figure 8:
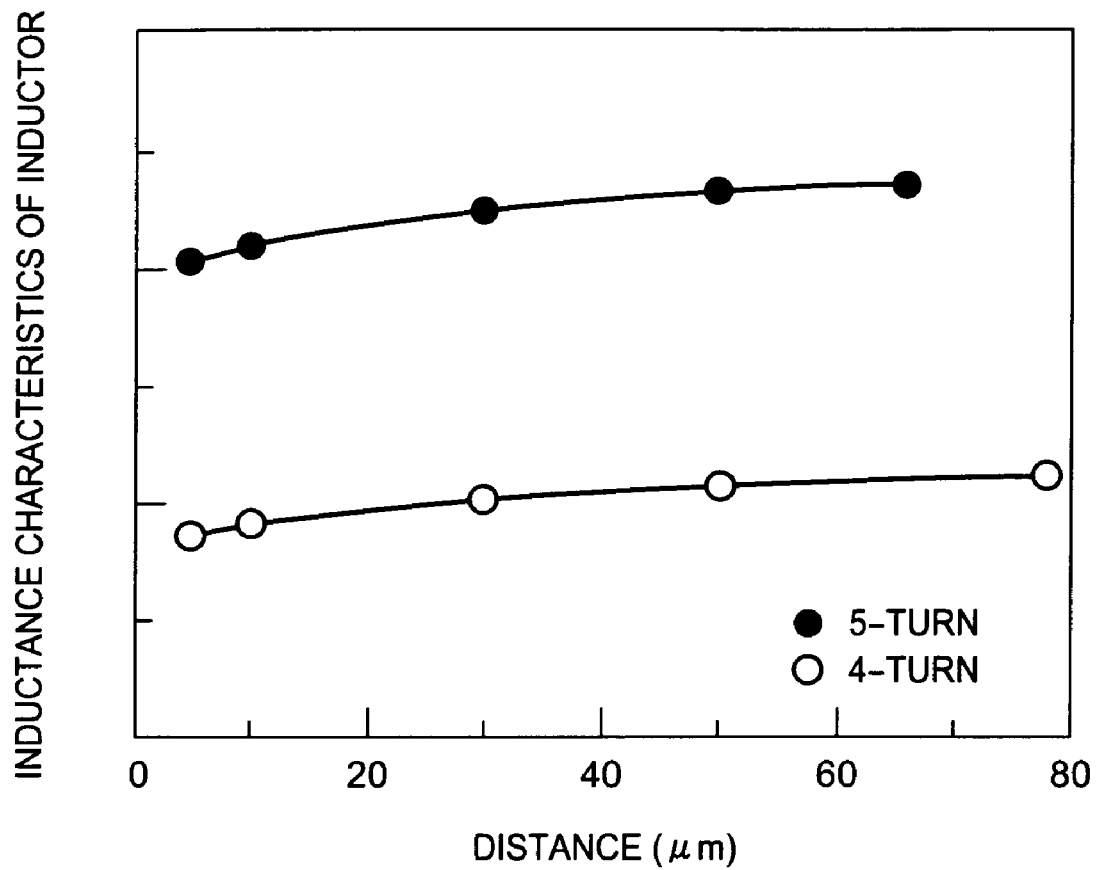
FIG. 8 is a diagram showing a relationship between a distance from an inductor to its surrounding dummy metals and the characteristics of the inductor.

FIG. 8 is a diagram for showing a relationship between a distance between an inductor and its surrounding dummy metals and the characteristic of the inductor. Here, 4-turn and 5-turn inductors are used as the high frequency wirings 102, respectively and a 3 GHz frequency current is flown in each object. The dummy metals are provided in the same layer as that of each of the inductors. If the distance between the inductor and the dummy metals is 50 μm or over, then almost no fluctuation appears in the inductance characteristics of any of the 4-turn and 5-turn inductors. If the distance between the inductor and the dummy metals is 30 μm or under, then however, the inductance characteristics of the inductor will be degraded. This result has come to a conclusion that the second region 108 can be formed within a radius of about 50 μm or over around the first region 106.

If a plurality of third wiring layers 122c are disposed on the first wiring layer 122a, then however, dummy metals 104 can be disposed evenly in all the regions at a top view in the third wiring layer 122c formed over the high frequency wiring 102 by a predetermined distance, for example, by 50 μm or over from the surface of the wiring 102. This is because the dummy metals 104 affect the characteristics of the high frequency wiring 102 less in the regions over the high frequency wiring 102 separated by a predetermined distance from its surface and in the regions at both sides of the wiring 102.

In case of the present micro CMOS process, dummy metals provided in each layer of a multilayer wiring layer are always disposed at a rougher density than that allowed for the process according to the layout information of each layer, the material of the insulation film in the layer, and other conditions. In this first exemplary embodiment, the dummy metals 104 are disposed in the external region 112 at a conventional density while they are disposed in the region 110 at a lower density within an allowable range of the process, for example, the disposition pattern of the dummy metals 104 is determined by the minimum density value. Hereunder, there will be described the procedures of how to determine such a disposition pattern of the dummy metals 104.

Figure 4:
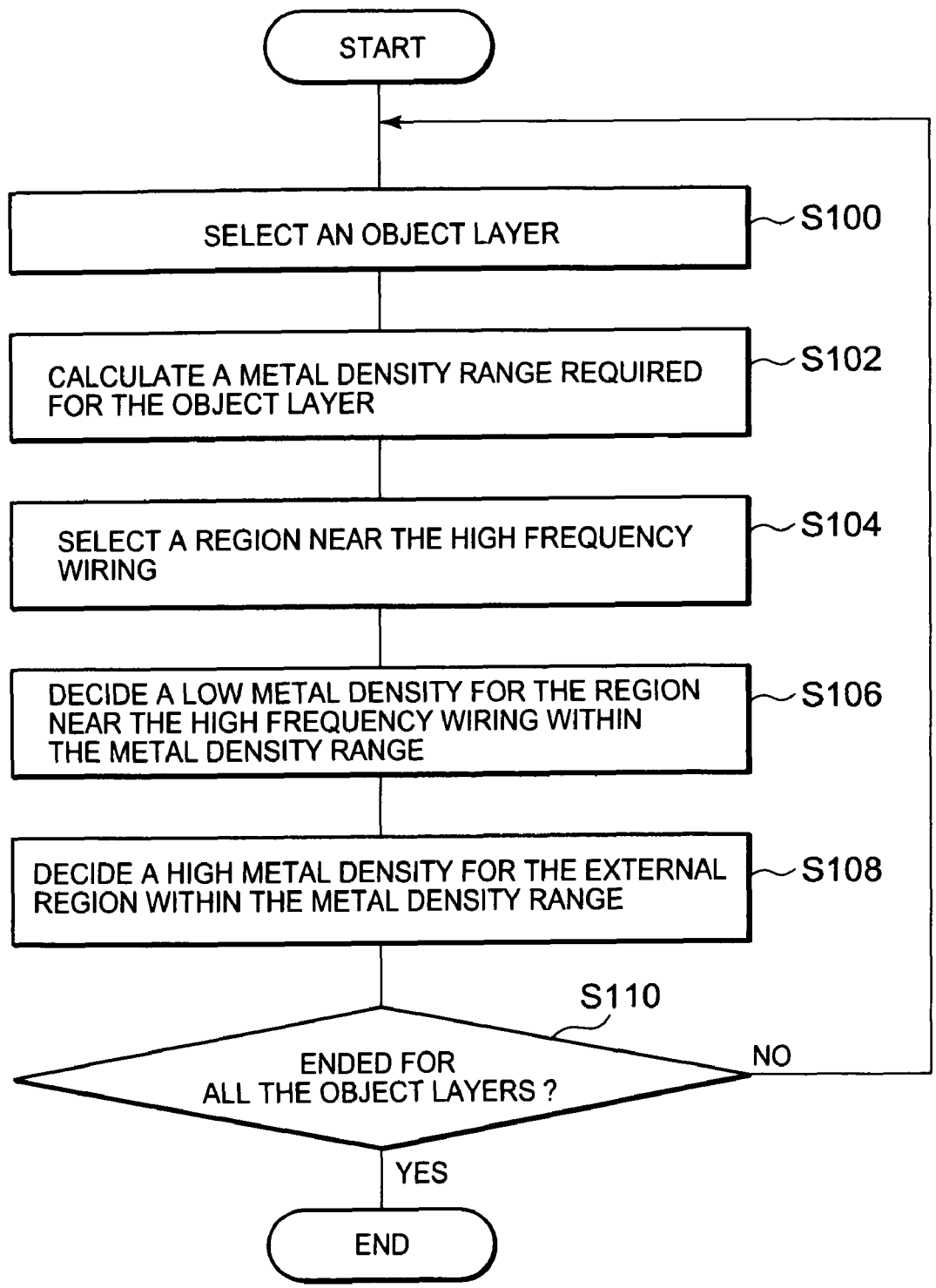
FIG. 4 is a flowchart of the procedures for deciding a disposition pattern of dummy metals in the exemplary embodiment.

FIG. 4 is a flowchart of the procedures for deciding a disposition pattern of the dummy metals 104.

At first, an object layer is selected (S100). Then, an allowable range is figured out for the necessary metal density in the layer according to the layout information of the conductive pattern required for the circuit configuration of the semiconductor device 100 in the layer, the insulation film material of the layer, etc. (S102). This processing is the same as that for deciding the disposition pattern of conventional dummy metals. Conventionally, the disposition pattern of dummy metals is decided so as to obtain a certain high metal density, for example, an intermediate level density within the necessary density range figured out as described above.

After that, according to the top view of the semiconductor device 100, an object region near the high frequency wiring 110 is selected (S104). Then, the metal density in the region 110 is decided. Here, the metal density in the region 110 is decided to be a low density within the metal density allowable range figured out in step S102. Then, the disposition pattern of the dummy metals 104 is decided so as to dispose the dummy metals 104 in the decided metal density (S106). For example, the metal density in the region 110 can be the lowest limit of the metal density allowable range figured out in step S102.

After that, the metal density in the external region 112 is decided to be a high density in the metal density allowable range figured out in step S102 and the disposition pattern of the dummy metals 104 is decided so as to enable the dummy metals to be disposed at the decided metal density (S108). Here, the high density means a metal density higher than that in the region 110 decided in step S106. The metal density in the external region 112 can be, for example, an intermediate level in the metal density allowable range figured out in step S102 just like the conventional one.

The above processing is repeated for all the object layers (until YES is selected in step S110). The disposition density of the dummy metals 104 is decided for each layer in accordance with each layer layout information, the material of the insulation film in the object layer, etc. and the disposition pattern of the dummy metals 104 is decided so as to enable the dummy metals 104 to be disposed at the decided metal density. Consequently, the average interval and density of the dummy metals 104 might differ among those layers. In each layer, however, the disposition pattern of the dummy metals 104 in the external region 112 is decided so that the average interval or density of the dummy metals in the region 110 becomes lower than that in the external region 112.

Next, there will be described the effect of this first exemplary embodiment.

In the semiconductor device 100, the disposition pattern of the dummy metals 104 is decided rougher in the regions 110 at a side of, over, and under the high frequency wiring 102 than in the external region 112 other than those regions. This means that the number of dummy metals 104 is reduced in each region to be affected easily by the magnetic field of the high frequency wiring 102 in such a way, thereby the overcurrent to be generated in the dummy metals 104 can be suppressed. Particularly, if many dummy metals 104 are disposed in a region near the high frequency wiring between the first wiring layer 122a including the formed high frequency wiring 102 and the semiconductor substrate 120, then the dielectric substance between the high frequency wiring 102 and the semiconductor substrate 120 is reduced in thickness, so the parasitic capacity increases. In this first exemplary embodiment, therefore, the number of dummy metals 104 is minimized in such a region 106. The characteristics of the high frequency wiring 102 can be therefore prevented from degradation. Even in the regions near the high frequency wiring 110, the minimum number of the dummy metals 104 is disposed dispersedly, thereby erosion, dishing, or the like can be prevented effectively.

The high frequency wiring 102 in this first exemplary embodiment is assumed as an inductor. In this case, if a magnetic field is generated in a direction in which the overcurrent cancels the magnetic field of the inductor, the intensity of the inductor magnetic field falls. This falling of the magnetic field intensity comes to degrade the Q value of the inductor. According to this first exemplary embodiment, however, the overcurrent can be suppressed as described above, so the degradation of the Q value can also be suppressed effectively.

The fluctuation of the circuit constant of the high frequency wiring 102 to be caused by the overcurrent of the dummy metals 104 appears remarkably when a current of 5 GHz or over flows in the high frequency wiring. In this case, the first exemplary embodiment can effectively suppress the overcurrent to be generated in the dummy metals 104.

Second Exemplary Embodiment

In this second exemplary embodiment, a guard ring 116 is provided between a vicinity region 110 surrounding the high frequency wiring 102 and the external region 112. This makes a difference between the semiconductor device in this second embodiment and that 100 in the first embodiment described with reference to FIGS. 1 through 3. The high frequency wiring 102 may be an inductor.

Figure 5:
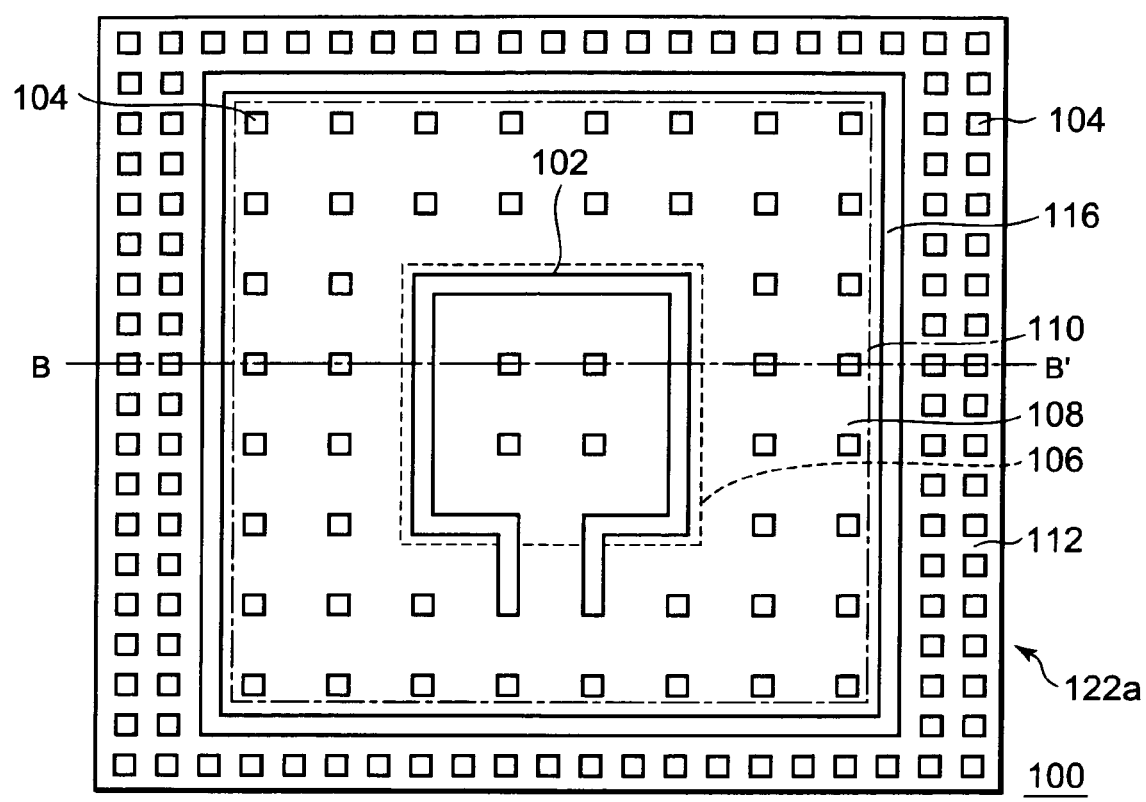
FIG. 5 is a top view of a semiconductor device in another exemplary embodiment of the present invention.
Figure 6:
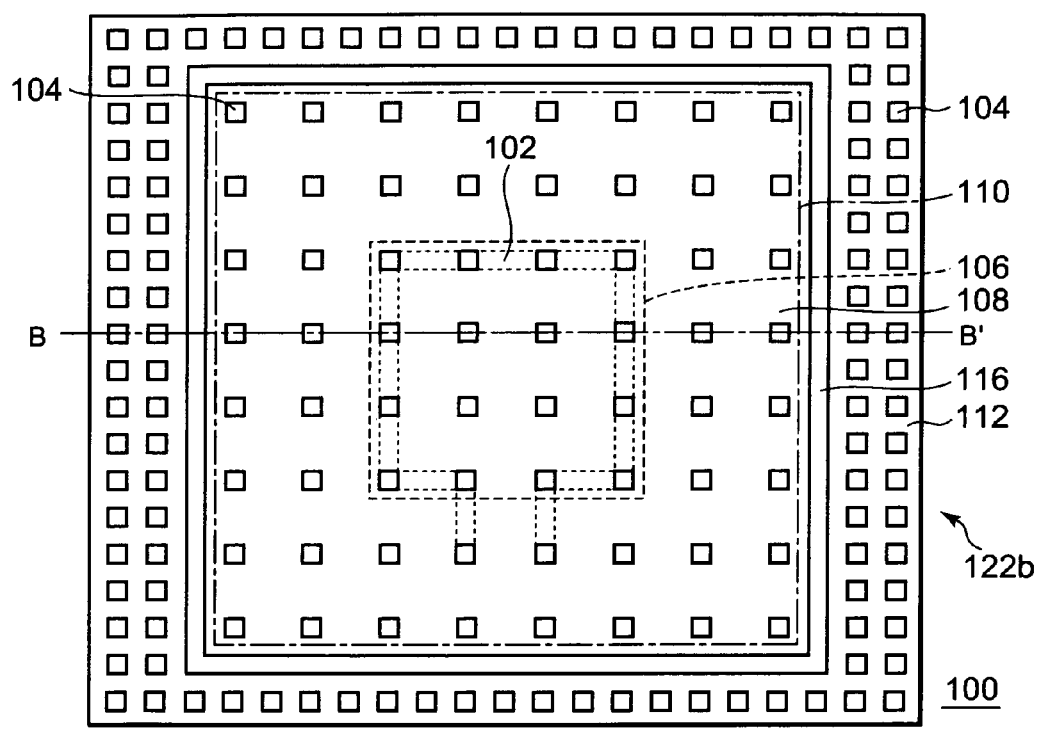
FIG. 6 is a top view of a semiconductor device in still another exemplary embodiment of the present invention.
Figure 7:
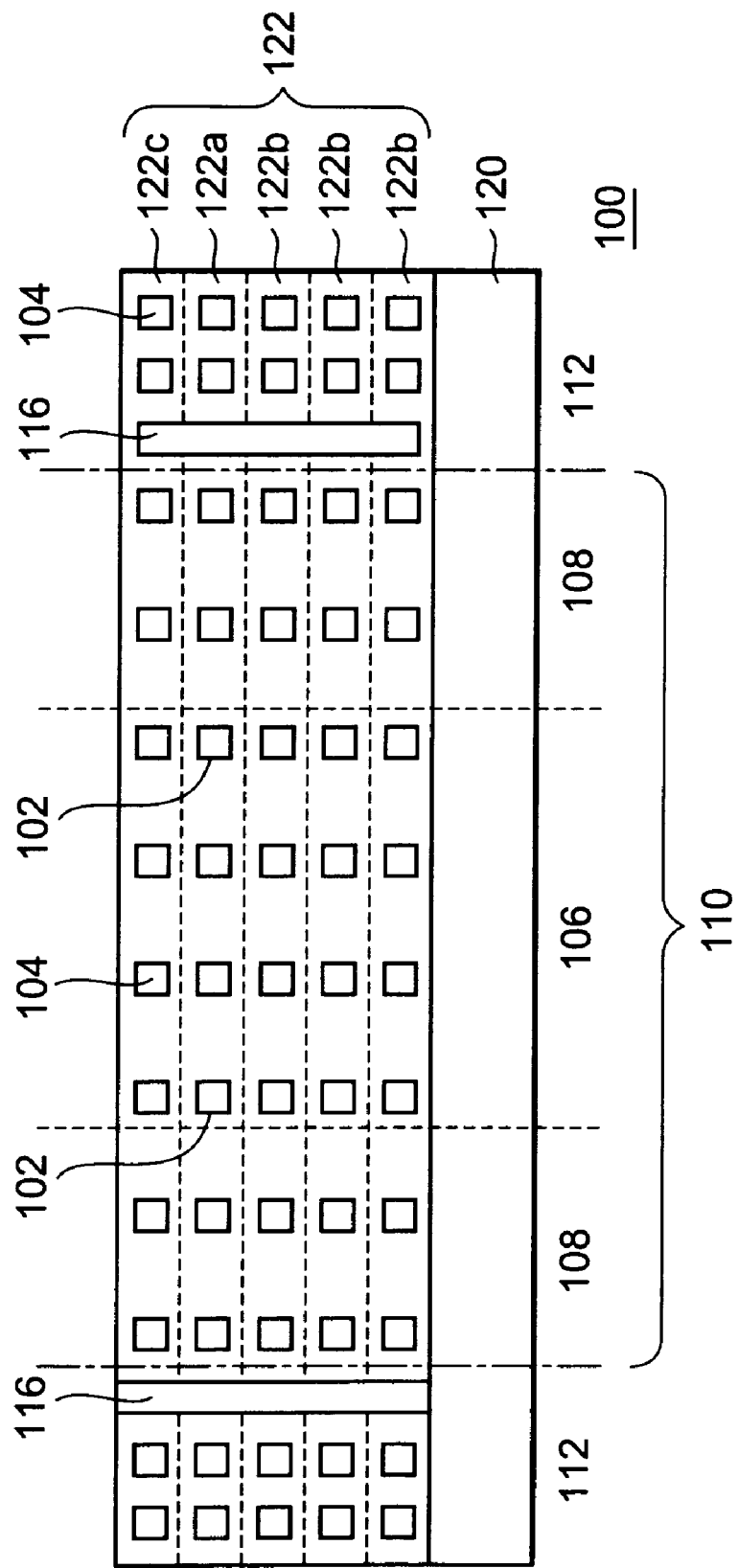
FIG. 7 is a cross sectional view taken on line B-B' of FIGS. 5 and 6.

FIGS. 5 and 6 are top views of the configuration of a semiconductor device 100 in this second exemplary embodiment. FIG. 7 is a cross sectional view taken on line B-B' of FIG. 6. FIG. 5 is a top view of the first wiring layer 122a (first layer) having the high frequency wiring 102. FIG. 6 is a top view of the second wiring layer 122b (second layer) provided between the first wiring layer 122a and the semiconductor substrate 120.

As shown in FIG. 7, the guard ring 116 can be formed as a continuous element through all the layers of the multilayer wiring layer 122. Although not limited specially, the guard ring 116 in a via layer can be formed by a slit via.

Although the guard ring 116 is provided in the external region 112 here, the guard ring 116 can also be provided at the phase boundary between each region 110 and the external region 112. The region 110 and the external region 112 can be partitioned by the guard ring 116. The high frequency wiring 102 may be surrounded by the guard ring 116. When such a configuration is employed, the disposition pattern of the dummy metals 104 can be decided by assuming the inside of the guard ring 116 as the region 110 and the outside of the guard ring 116 as the external region 112 respectively. The guard ring functions to reduce the influence by the high frequency wiring to be exerted on the elements formed in the external region 112. The guard ring is connected to, for example, the ground potential.

Even in this second exemplary embodiment, the same effect as that of the first exemplary embodiment can be obtained.

While the present invention have been described with reference to the accompanying drawings, it is to be understood that modifications will be apparent to those skilled in the art without departing the spirit of the invention.

Although the high frequency wiring 102 is formed in one first wiring layer 122a in the exemplary embodiments described above, the high frequency wiring 102 can also be formed in a plurality of wiring layers. Also in this case, in each layer in which the high frequency wiring 102 is formed, the dummy metals 104 can be disposed dispersedly so that the average interval between each of the dummy metals 104 in each vicinity region 110 becomes wider than that in the external region 112.

Furthermore, in the first and second exemplary embodiments described above, the high frequency wiring 102 is shaped like a coil at a top view. However, the high frequency wiring 102 can also be formed in various patterns at the top view, for example, in a zigzag pattern, or in a toroidal pattern that forms a ring of the center axis in a direction horizontal to the semiconductor substrate 120. Also in this case, a region that includes a first region surrounded by the outer edge of the high frequency wiring 102 disposed region and a second region surrounding the first region at the top view can be assumed as a region near the high frequency wiring 110.

If the multilayer wiring layer 122 of the semiconductor device 100 is formed in a single damascene process, then there is no need to form the dummy metals 104 in the via layer. This is because dishing, etc. that might cause process variations in the CMP process are not generated in the via layer so often when compared with the wiring layer. However, dummy metals 104 may also be provided in the via layer.

Further, it is noted that Applicant's intent is to encompass equivalents of all claim elements, even if amended later during prosecution.

What is claimed is:

1. A semiconductor device, comprising:
    a semiconductor substrate;
    a wiring layer provided on the semiconductor substrate;
    a high frequency wiring provided in the wiring layer; and
    plural dummy metals provided in the wiring layer apart from the high frequency wiring,
    wherein the wiring layer in plan view includes a high frequency wiring vicinity region and an external region surrounding the high frequency wiring vicinity region,
    wherein the high frequency wiring vicinity region includes a first region enclosed by an outer edge of the high frequency wiring, and a second region surrounding the first region,
    wherein the plural dummy metals are disposed dispersedly in the high frequency wiring vicinity region and in the external region respectively, and
    wherein an average interval between the dummy metals in the high frequency wiring vicinity region is wider than that in the external region.

2. The semiconductor device according to claim 1, wherein the second region is formed within a radius of 50 μm or more around the first region.

3. The semiconductor device according to claim 2, wherein the wiring layer comprises a first wiring layer and the plural dummy metals comprise plural second dummy metals,
    wherein the semiconductor device further comprises a second wiring layer provided between the first wiring layer and the semiconductor substrate, and
    wherein plural second dummy metals are disposed dispersedly in the second wiring layer, the plural second dummy metals being provided in a region superposed on the high frequency wiring in plan view.

4. The semiconductor device according to claim 1, further comprising:
    a guard ring surrounding the high frequency wiring in plan view, the guard ring being provided in at least the wiring layer,
    wherein the high frequency wiring vicinity region is arranged inside the guard ring and is arranged between the external region and the high frequency wiring vicinity region.

* * * * *